(12) United States Patent
Casset et al.

(10) Patent No.: US 7,851,366 B2
(45) Date of Patent: Dec. 14, 2010

(54) FORMING A SACRIFICIAL LAYER IN ORDER TO REALISE A SUSPENDED ELEMENT

(75) Inventors: Fabrice Casset, Tencin (FR); Sofiane Soulimane, Toulouse (FR)

(73) Assignee: Commissariat A l'Energie Atomique, Paris (FR)

( * ) Notice: Subject to any disclaimer, the term of this patent is extended or adjusted under 35 U.S.C. 154(b) by 400 days.

(21) Appl. No.: 11/854,155

(22) Filed: Sep. 12, 2007

(65) Prior Publication Data

US 2008/0090421 A1  Apr. 17, 2008

(30) Foreign Application Priority Data

Sep. 15, 2006  (FR) .................................. 06 53779

(51) Int. Cl.
*H01L 21/311* (2006.01)

(52) U.S. Cl. ............................... 438/703; 257/E21.249

(58) Field of Classification Search ................. 438/703; 257/E21.249
See application file for complete search history.

(56) References Cited

U.S. PATENT DOCUMENTS

2005/0227428 A1  10/2005  Mihai et al.

FOREIGN PATENT DOCUMENTS

WO  WO 03/078299 A1  9/2003

OTHER PUBLICATIONS

Sofiane Soulimane, et al., "Polymeric material sacrificial layer for MEMS fabrication", Nanofun-Poly International Conference, XP-002432492, May 31, 2006, 2 pages.
A. J. Gallant, et al., "Sacrificial layers for Widely tunable capacitors", IEE Proceedings Science Measurement and Tehcnology, vol. 151, No. 2, XP-006021520, Mar. 3, 2004, pp. 104-109.

*Primary Examiner*—Matthew C Landau
*Assistant Examiner*—Sonya D McCall-Shepard
(74) *Attorney, Agent, or Firm*—Oblon, Spivak, McClelland, Maier & Neustadt, L.L.P.

(57) ABSTRACT

The invention relates to a method of realization of a sacrificial layer, including the steps of:
lithography of a resin deposited on a substrate in order to supply a lithographed resist pattern on a substrate zone, the zone having a given size and a given form, the pattern occupying a given volume,
annealed according to a thermal cycle of the lithographed resist pattern,
the method being characterised in that it includes, according to the resin, the determination of the size and of the form of said zone of the substrate, and the determination of the volume of the resin deposited on said zone so that the thermal cycle annealing supplies a profile chosen from among the following profiles: a planarising domed profile and a "double air gap" profile.

5 Claims, 9 Drawing Sheets

FORMING A SACRIFICIAL LAYER IN ORDER TO REALISE A SUSPENDED ELEMENT

TECHNICAL FIELD

The invention relates to a method of forming a sacrificial layer in order to realize a suspended element (beam or membrane) especially in an MEMS. It can also apply to other fields in electronics and microelectronics that use variable capacitors, switches and resonators.

PRIOR ART

The development of smaller and smaller high-performance portable devices encourages the search for new components in order to realize new functionality. In radiofrequency applications, microelectromechanical systems (MEMS) are credible alternatives to "traditional" components in microelectronics through their integration and their theoretical performance.

The operating principle of MEMS is based on the mechanical movement of a membrane or of a beam suspended above a substrate. For this, the MEMS development often requires the use of a sacrificial layer allowing an element (beam or membrane) to be suspended so that it is mobile or isolated from the substrate.

As with integrated circuits in microelectronics, these devices are manufactured by stacking different thin layers of different materials. Moreover, in order to define a particular geometry, these materials can be annealed, polished, etched partially (by using photolithography) or fully as is the case with the sacrificial layer.

An MEMS component can include a cavity and discontinuous electrodes creating a surface topology of the substrate. But this remains an example since it is possible to have a membrane without a cavity as is the case for encapsulation or with a continuous electrode as with resonators, etc.

Realising an MEMS must take into account the requirements in the specifications. These requirements include for example, in the case of a membrane: the actuation voltage and/or the amplitude of membrane movement, resonance frequency, mechanical properties of the membrane, etc.

Using these specifications, a dimensional calculation of the membrane according to the chosen constitutive material is carried out. Finished element calculation software (ANSYS, COVENTOR, etc.) is used and/or analytical formulas of beam mechanics (see document [1] placed at the end of the description). From this we obtain length L of the membrane, its width l, its thickness e, its rigidity k and the gap (thus the distance between the electrodes of a switch) d.

This dimensioning provides information on whether or not there is a need to have a cavity under the membrane. Indeed, according to the material chosen for the membrane (nitride/gold, gold, Al, AlSi, Si, polySi, oxide, etc.) and its intrinsic constraint which is going to cause a displacement of the membrane during etching of the sacrificial layer, the remaining gap can be provided for. According to the considered gap, it may be necessary to provide for a cavity whose depth shall be determined.

This cavity will have an approximate length of L. Its depth will be according to d.

Then, the sacrificial layer to be used and its thickness can be chosen (according to cavity depth, d and having to be compatible with the membrane material (the profile of the sacrificial layer must resist the deposition temperature of the membrane and must be able to be etched easily). The method of realisation is defined in concordance with the materials of the sacrificial layer and of the membrane.

The method of realisation includes the steps of deposition, photolithography and etching, forming the sacrificial layer, realizing the membrane and etching of the sacrificial layer.

The material sought to realize the sacrificial layer must satisfy the following characteristics: be thermally stable in order to withstand the thermal budget of the later steps, be easy to implement, be able to planarise the topology of the surface on which it is deposited, not leave any residue when it is removed.

Three types of sacrificial layers known by those skilled in the art can be distinguished: organic substances of the photosensitive polymer type, organic substances of the non-photosensitive polymer type such as polyimide, non-organic substances such as silicon dioxide, chrome, copper, tungsten.

Controlling the distance separating an electrode (positioned on a suspended element) from the facing substrate, and equipped with another electrode, is a major point in the proper functioning of an MEMS. It requires stringent control of the sacrificial layer which must have the minimum of topology with a controlled profile and high thermal stability that is higher than the deposition temperature of the membrane or of the microbeam.

Non-photosensitive polymers are difficult to implement and require the use of another material above them which is photosensitive or which reproduces the patterns to be etched, in order to be etched. Non-organic materials are well controlled in terms of thickness, but on the other hand they reproduce the topology on which they are deposited. In order to have a non-organic planar sacrificial layer, an expensive polishing step (CMP) is required. Furthermore, non-photosensitive polymers and non-organic materials require suitable etching techniques and are generally harder to manipulate and to remove during releasing, leaving residue.

Photosensitive polymers used in known art are also not very planarising. As such, the topology under the sacrificial layer will be replicated on the membrane produced on top. Document [2], placed at the end of the description, discloses a planarisation test of a multilayer polymeric sacrificial layer. The profile obtained has a pit which can be problematic in certain cases (compression membrane).

Sacrificial layers make it possible to realise a variety of components: variable capacitors, micro-switches, resonators or micromechanical filters that function on mechanical resonance modes of micrometric systems, FBAR ("Film Bulk Acoustic Resonator") devices, sensors such as accelerometers, gyrometers, etc.

We shall go more in depth with the example of the variable capacitor. Capacitance is defined between two facing electrodes by the following expression: $C = \in S/d$, C being the capacitance value of the capacitor, $\in$ the value of the permittivity of the medium between the electrodes, S the facing surface and d the distance between the electrodes.

In order to vary the capacitance of the capacitor, there are three known means: variation in the distance between the electrodes (variable gap capacitor), variation in the surface of the facing electrodes (variable surface capacitor) and variation in permittivity between the electrodes.

The most advantageous component is the variable gap electrostatic variable capacitor. But it has the problem referred to as "pull-in" (gluing of the electrodes to ⅓ of the gap). In order to avoid this problem, a "double air gap" can be considered. The principle of the "double air gap" structure has been presented in documents [3] and [4] mentioned at the end of the description. This structure includes actuation electrodes forming a capacitor whose gap is greater than that of the variable capacitor, in such a way as to avoid the "pull-in" phenomenon.

"Double air gap" variable capacitors known in the art require a multiplication of the deposition—photolithography—etching steps in order to obtain the "double air gap" as well as an expensive polishing step via CMP in order to planarise the sacrificial layer.

DISCLOSURE OF THE INVENTION

This invention was designed in order to form the sacrificial layer while simplifying its method of realisation. It makes it possible to planarise a sacrificial layer. It also makes it possible to realise a "double air gap" variable capacitor at least cost.

The purpose of the invention is a method for realising a sacrificial layer, including the steps of:
  lithography of a resin deposited on a substrate in order to provide a lithographed resist pattern on a substrate zone, the zone having a given size and a given form, the pattern occupying a given volume,
  annealed according to a thermal cycle of the lithographed resist pattern,
the method being characterised in that it includes, according to the resin, the determination of the size and of the form of said zone of the substrate, and the determination of the volume of the resin deposited on said zone so that the thermal cycle annealing supplies a profile chosen from among one of the following profiles: a planarising domed profile and a "double air gap" profile, wherein, the sacrificial layer being intended to serve as a support for forming a suspended element, the determination of the size and of the form of said zone and the determination of the volume of the resin deposited on said zone are obtained by delimiting a resonance frequency range for the suspended element, which defines the interval that must separate the suspended element from said substrate zone, with the resin then being chosen in order to procure a pattern able to supply said interval.

The resin can be a photosensitive polymer resin.

The zone of the substrate can be constituted by the bottom of a cavity realised in the substrate.

According to a first alternative of implementation, said zone of the substrate having a surface topology, the lithography and annealing steps are realised in several steps, the method including:
  a first lithography step carried out using a first layer of resin supplying a first pattern element by means of a mask,
  a first annealing step of the first pattern element,
  a thinning step of the first pattern element in order to minimise the surface topology of said zone reproduced at the first pattern element,
  a second lithography step carried out using a second layer of resin deposited on the substrate, supplying, by means of said mask, a second pattern element superposed on the first thinned pattern element in order to constitute said pattern,
  a second annealing step applied to the pattern obtained, the first annealing step and the second annealing step supplying a planarising domed profile to the pattern obtained.

According to a second alternative of implementation, said zone of the substrate having a surface topology, the lithography and annealing steps are realised in several steps, the method including:
  a first lithography step carried out using a first layer of resin supplying a first pattern element by means of a mask,
  a first annealing step of the first pattern element,
  a thinning step of the first pattern element in order to minimise the surface topology of said zone reproduced at the surface of the first pattern element,
  a second lithography step carried out using a second layer of resin deposited on the substrate, supplying, by means of said mask, a second pattern element superposed on the first thinned pattern element,
  a second annealing step applied to the superposition of the first pattern element and of the second pattern element, causing the appearance of two peaks on said superposition, constituting a "double air gap" profile,
  a third lithography step carried out using a third layer of resin deposited on the substrate, supplying, by means of said mask, a third pattern element superposed on the first pattern element and on the second thinned pattern element,
  a third annealing step applied to the superposition of pattern elements obtained in order to give the obtained pattern the "double air gap" final profile.

BRIEF DESCRIPTION OF THE DRAWINGS

The invention will be better understood and other advantages and particularities shall appear when reading the following description, given by way of non-limited limited example, accompanied with annexed drawings among which.

DETAILED DISCLOSURE OF PARTICULAR EMBODIMENTS

Several parameters can influence the final aspect of the sacrificial layer, in particular the manner of depositing the photosensitive polymer resin, the type of polymer, its viscosity, its adhesion capacity, the thermal treatment subsequent to the deposition, solvents used during dilution, the atmospheric conditions (temperature and humidity) and storage conditions.

In order to understand how these parameters change, the sequences of implementing this sacrificial layer must be known. The method of realisation of a suspended element includes the steps of depositing the resin, and of annealing (for example towards 90° C.) in order to give strength to the resin, insolation of the resin, revelation or development of the resin, of the thermal cycle which continues via the deposition of the suspended element and the etching of openings in order to obtain access to the sacrificial layer and its removal.

Figure 1:
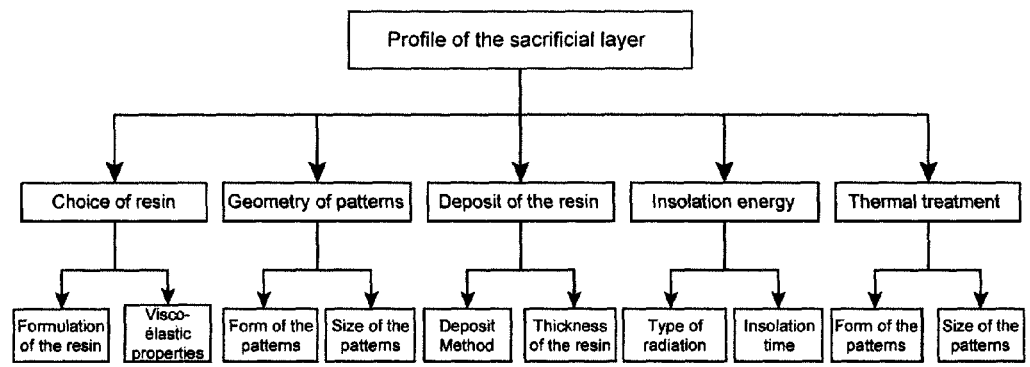
FIG. 1 is a flow chart with details on the parameters that influence the final profile of the sacrificial layer.

Optimising the profile of the sacrificial layer corresponds to optimising each step in the realisation sequence. The first steps are considered as standard in lithography. The invention shall be substantially based on the thermal treatment and the manner in which the profile varies according to geometrical constraints in surface (size and form of the patterns) and in volume (cavities on lower electrode lines, etc.). FIG. 1 is a flow chart which details the parameters that influence the final profile of the sacrificial layer, i.e. the choice of the resin (its formulation and its viscoelastic properties), the geometry of the patterns (their form and their size), the deposit of the resin (the method used to deposit it and its thickness), the insolation energy (the type of radiation and the insolation time), the thermal treatment applied (in relation to the form and size of the patterns).

Depositing the resin is more preferably carried out thanks to a spin coater, since electrodeposition requires a surface that if fully conductive. The effect of radiation on resins is governed by their absorption domains. This conditions chemists to formulate resins that are sensitive to near or deep ultraviolet radiation. Radiation control is governed by the insolation time and the dose of exposure energy. Consequently, the choice of resin conditions not only the exposure interval but also the viscoelastic properties of the matrix according to the temperature that is passed back on the behaviour according to the temperature, surface topology and geometry of the patterns.

According to the invention, a printing method is implemented with resins that are formulated to obtain patterns with straight flanks after lithography. The use of the latter as sacrificial layers involves a special method in order to obtain a working passage with low slope (in order to ensure deposition continuity).

In general, a photosensitive resin is a formulation of a photopolymer solution which becomes sensitive to radiation after drying. This formulation allows for deposition in a liquid state on a metal or on other substrates with a drying step before insolation. A resin is an organic compound, generally including a thermoplastic polymer, whose solubility is affected by UV radiation. There are two types de resins:

Negative photoresists: the UV radiation causes the exposed zones to be polymerised, thus giving these zones particular strength for the development solvent while the non-isolated portions disappear selectively in this solvent.

Positive photoresists: the UV radiation causes a breakdown in the macromolecules, hence the increased solubility of the zones exposed in the developer.

The properties of the resin are guided by photochemical modifications of the photoactive material, which results in the change from a solubility standpoint with the speeds of dissolution of the film varying by a factor of 100. Several resins from different suppliers were used: JSR 335 positive photoresist available from JSR Corporation, Series S1800 positive photoresist available from Rhom and Haas (Shipley), MAP 1275 positive photoresist available from Microresist Technology and SC Resist negative photoresist available from Arch Chemicals.

The purpose of the thermal treatment step is to harden the resin, improve adhesion and remove all the residue from the solvent. This step also prepares the resin to undergo a subsequent step in the method (deposit of the membrane). The effect of this step acts directly on the evaporation of the small molecules. This phenomenon makes it possible to increase the glass transition temperature "$T_g$" and consequently increase the thermal stability of the film since this temperature is considered to be the limit of stability for the final profile of the sacrificial layer.

Figure 2A:
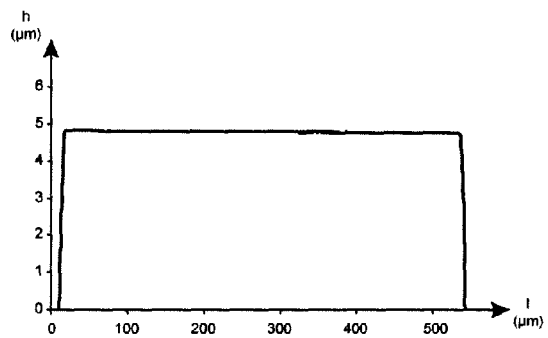
FIGS. 2A to 2C are charts showing the influence of temperature ramps on the final profile of a sacrificial layer pattern.
Figure 2B:
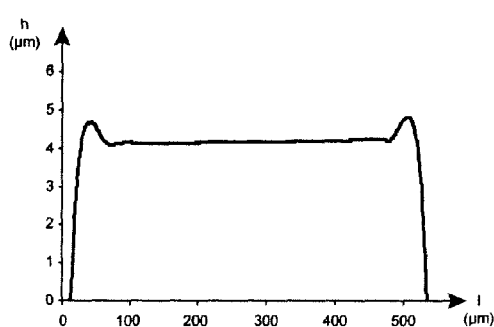
Figure 2C:
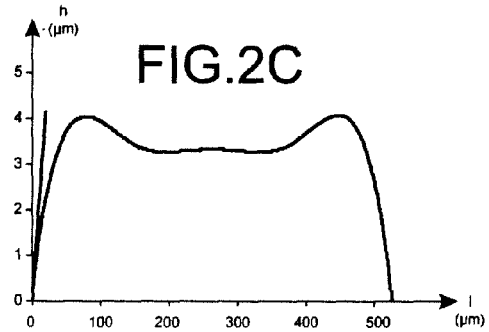

In order to evaluate the effect of the temperature, measurements were taken with a profile meter at different stages of the thermal treatment. FIGS. 2A to 2C are charts showing the influence of temperature ramps on the final profile of a sacrificial layer pattern. The x-axis shows width l of the profile and the y-axis shows the height h of the layer. FIG. 2A shows the final profile of the sacrificial layer after a second insolation annealing at 90° C. (slope of the edges of the sacrificial layer at 80°). FIG. 2C shows the final profile of the same sacrificial layer after a second insolation annealing at 120° C. (slope of the edges of the sacrificial layer at 50°). FIG. 3C shows the final profile of the same sacrificial layer after a second insolation annealing at 200° C. (slope of the edges of the sacrificial layer at 10°).

FIGS. 2A to 2C clearly show the appearance, between 90° C. and 120° C. annealing, of peaks that are going to increase up to a limit that depends on the thickness of the layer, whether or not a cavity where the pattern of the sacrificial layer is deposited is present, the viscosity and the formulation of the resin, etc.

It is clearly seen that the emergence of these peaks is a molecular rearrangement of the components of the resin caused by the thermal energy. The final profiles after thermal treatment show that the position of the peaks is closer and closer when increasing the thickness of the sacrificial layer, which means that for each thickness of the sacrificial layer (which depends on the resin and its viscosity) there is a limit to the pattern width which makes it possible to pass from a two-peak profile to a planarising domed profile as shown in FIGS. 3A and 3B.

Figure 3A:
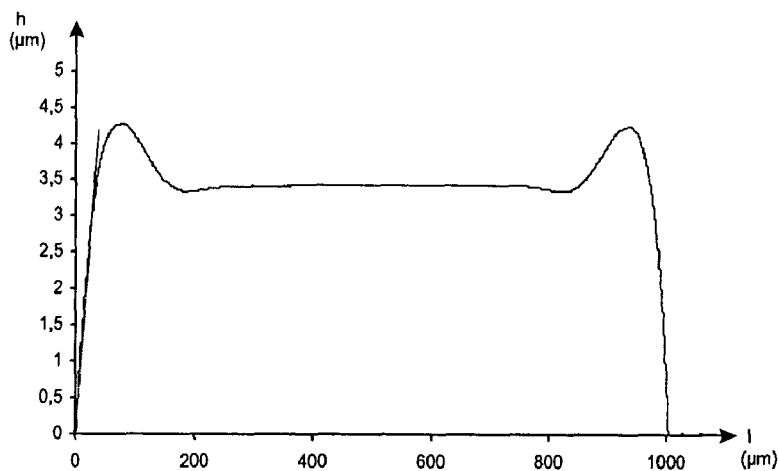
FIGS. 3A and 3B are charts showing the influence of the width of patterns on the profile of the sacrificial layer.
Figure 3B:
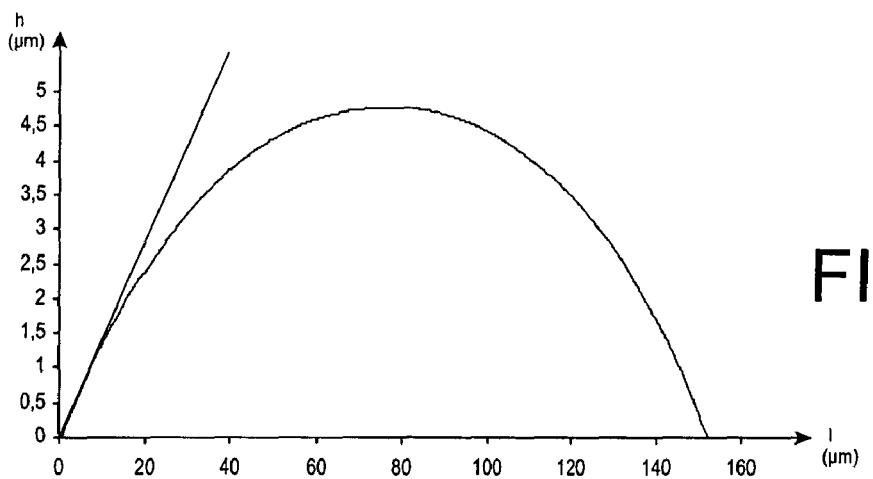

FIGS. 3A and 3B are charts, provided by a profile meter, showing the influence of the width of patterns, on which sacrificial layers are realised, on the profile of the sacrificial layer. The x-axis shows width l of the profile and the y-axis shows height h of the layer. For these figures, the resin used is the SR 335 resin and the desired height of the sacrificial layer is 4.5 μm. FIG. 3A shows the profile obtained for a large pattern (1000 μm in width) after annealing at 300° C. (slope of the edges of the sacrificial layer at 6°). FIG. 3B shows the profile obtained for a small pattern (145 μm in width) after annealing at 300° C. (slope of the edges of the sacrificial layer at 9°).

The small patterns have the planarising profile with a domed effect which constitutes an important result for MEMS resonators or other components of small dimension. As such, FIG. 4 shows the final profile of a thin sacrificial layer (height of approximately 200 nm).

Figure 4:
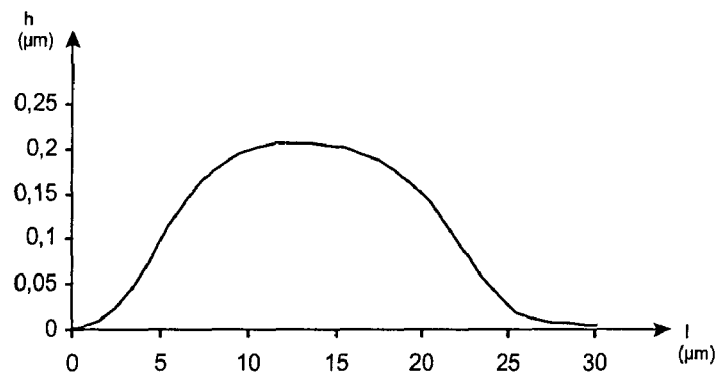
FIG. 4 is a chart showing a profile of a thin sacrificial layer.

The domed profile shown in FIGS. 3B and 4 is considered as the desired planar effect, in light of the slope of the edges of the sacrificial layer which is less than 10° and the relationship between the width of the pattern and the thickness of the sacrificial layer which is greater than 10.

If the patterns on which are produced the sacrificial layers are located in cavities formed using a face of a substrate, the same type of profile is observed as previously but the position of the peaks has a tendency to move towards the centre. This result confirms that non-appearance of peaks for small patterns. The fact of having a surface pattern with lower electrodes (contact paths), which constitute a topology over the surface, gives a new problem of topology which is reproduced by the sacrificial layer.

Figure 5A:
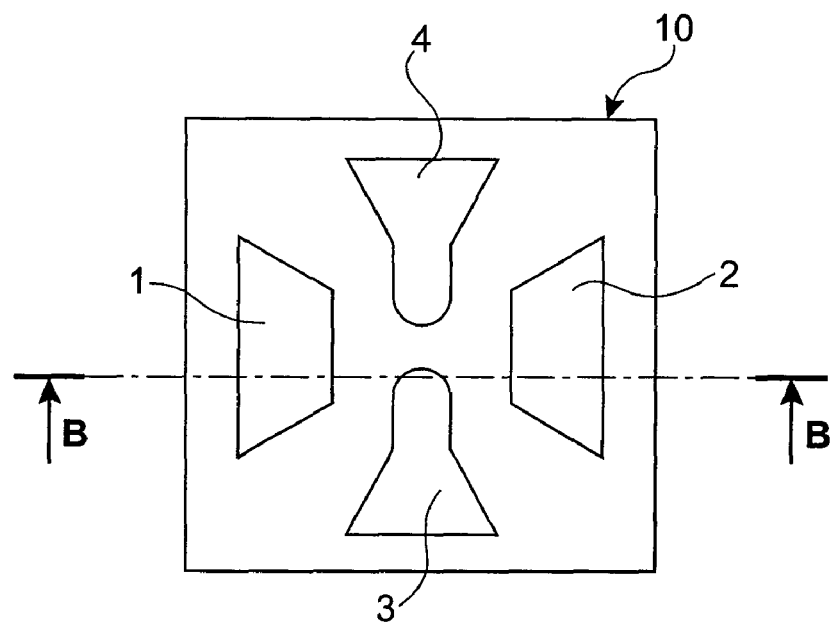
FIG. 5A is a top view of a portion of a substrate covered with electrically-conductive paths and FIG. 5B is a chart showing the profile of a sacrificial layer realised on this portion of substrate.
Figure 5B:
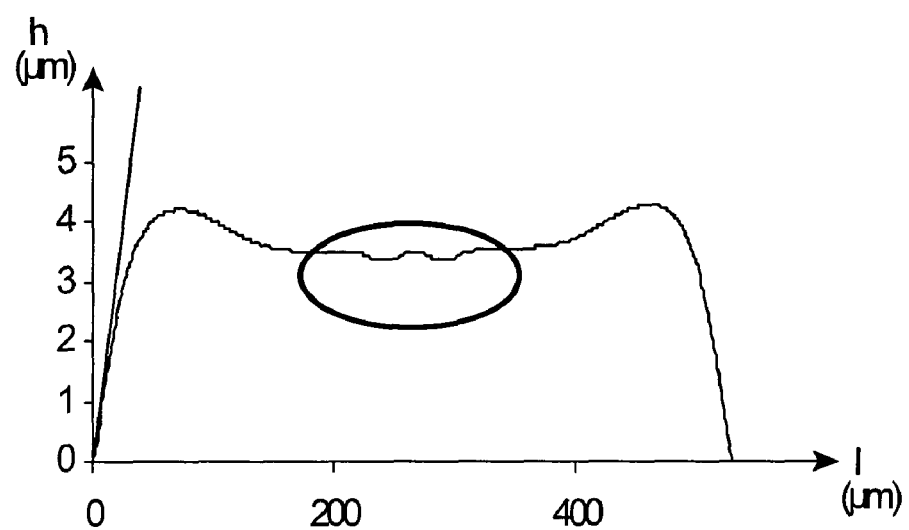

FIGS. 5A and 5B show this effect of surface topology reproduced at the surface of the sacrificial layer. FIG. 5A is a top view of a portion 10 of a substrate covered with electrically-conductive paths 1, 2, 3 and 4. FIG. 5B is a chart showing the profile of a sacrificial layer realised on portion 10 of the substrate. The x-axis shows width 1 of the sacrificial layer and the y-axis shows its height h. The profile shown on the chart corresponds to axis BB in FIG. 5A. The portion of profile surrounded by curve 5 in FIG. 5B is the topology of electrodes 1, 2 and 3 reproduced at the surface of the sacrificial layer.

To remedy this problem, according to the invention, a sacrificial bilayer is used and, after the thermal treatment applied to the first deposited sacrificial layer, thinning is carried out on this first layer. The use of a multilayer allows not only to planarise the sacrificial layer, but also to play on the build-up of the peaks in relation to the centre of the large patterns by varying the depth of the cavity, the width and the length of the patterns. This makes it possible to reach a "double air-gap" profile which can be used for variable capacitors.

To summarise, here is the influence of the most important parameters on the final profile of the sacrificial layer:

for a substrate without paths and without a cavity: appearance of peaks for large patterns, presence of a cavity: the peaks become closer to the centre of the pattern, presence of paths on the substrate: the peaks move away towards the exterior of the pattern, the topology of the paths is reproduced on the surface, application of a thermal cycle in an inert atmosphere: the peaks become closer to the centre of the pattern, increase of the viscosity of the resin: the peaks become closer to the centre of the pattern, increase in the thickness of the resin: the peaks become closer to the centre of the pattern, multilayer sacrificial layer: allows the "double air gap" gap to be generated.

The choice of the polymeric resin is conditioned by the deposition temperature of the suspended element (beam or membrane). The use of a photosensitive resin as a sacrificial layer immediately after the lithography step is not possible. Indeed, the lithographed resist layer cannot resist deposition temperatures of the suspended element greater than 100° C. since the glass transition temperature of the resin is very low. On the other hand, the profile of this layer is not very well suited to this type of application since the slope is too steep (70° to 90°). Thermal treatment constitutes an excellent alternative not only to end up with the sought profile (according to the application) but also to increase the thermal resistance of the profile of the sacrificial layer when the suspended element (beam, membrane) is deposited. Modifications in the chemical composition (solvent additives, polarity, etc.) and viscoelastic properties (molecular weight, conformation of macromolecular chains, etc.) of the sacrificial layer that result lead to better three-dimensional stability of the final profile after the thermal treatment. Thermal treatment techniques are varied. They consist in a succession of heating and cooling, whose cycles and temperatures are controlled with precision. For this invention, annealing is practiced with a heating speed that is sufficiently slow, for better organisation of the molecular chains and the evaporation of the small molecules. Slow cooling is required in order to avoid a thermal shock which would be harmful to the profile of the sacrificial layer. After this cycle, the final profile is stable up to glass transition temperature $T_g$ of the sacrificial layer. By setting the geometric parameters of the components and the material of the suspended element (deposit temperature), the circuit designer can use as a basis the thermal properties of the resins and the profile limit between the small and large patterns, in order to chose the layer that will have the highest glass transition temperature after the thermal cycle with the profile that is sought. Optimising the thermal treatment requires in general profile measurements with different thermal cycles in order to reach the best resistance to degradation.

Figure 6:
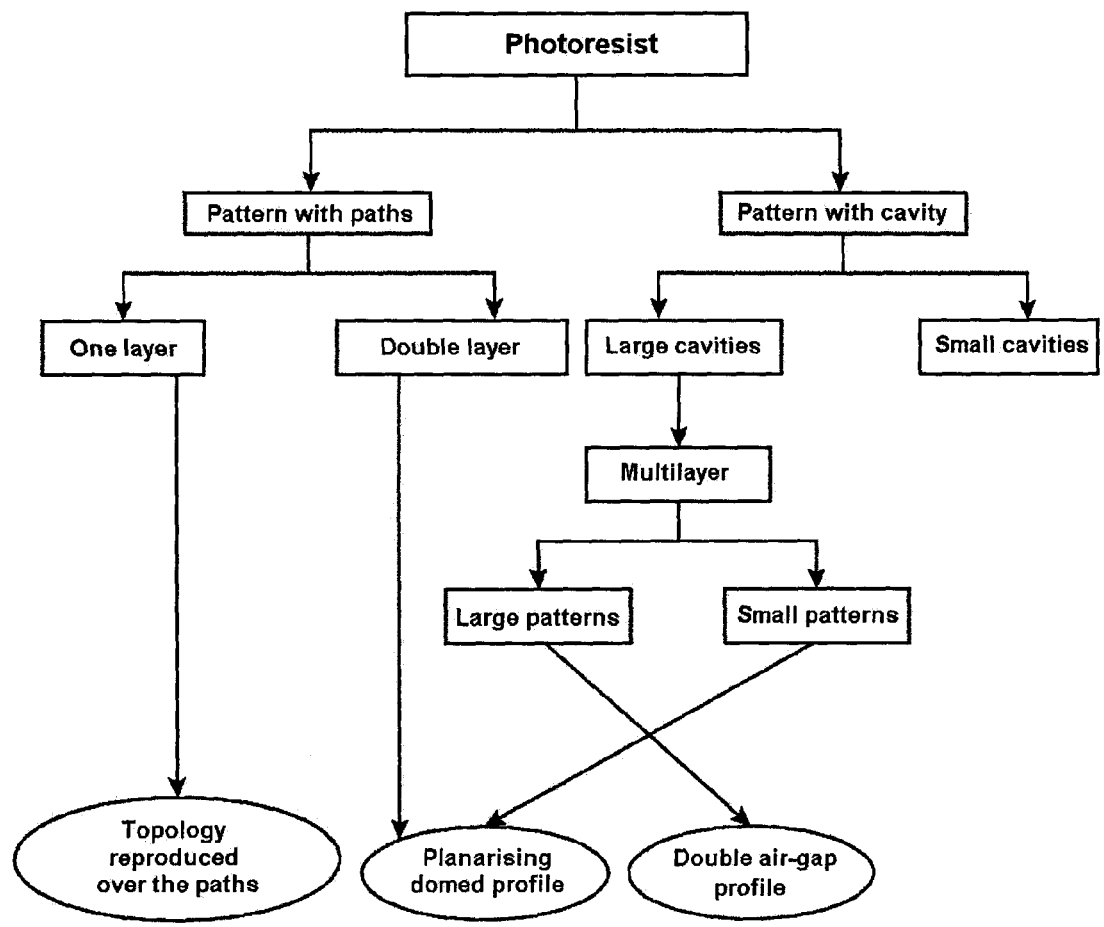
FIG. 6 shows a flow chart describing the influence of parameters on the profile of the sacrificial layer.

FIG. 6 is a flow chart describing the influence of the geometric patterns and of implementing the steps of the method on the profile of the sacrificial layer, knowing that the thickness of the sacrificial layer gives the limit between a small and large pattern.

Treatment of the sacrificial layer according to the invention allows suitable profiles to be obtained for all microsystems, sensors or MEMS. In this way, the sacrificial layer can be treated in order to planarise it so as to obtain high-performance micro-switches.

Figure 7A:
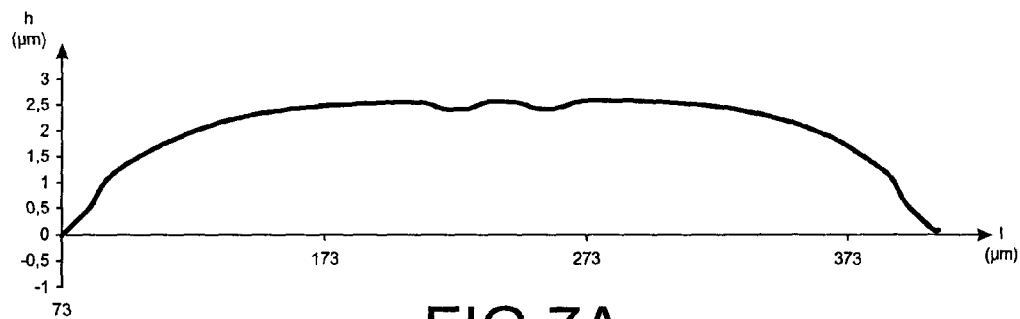
FIGS. 7A to 7C are charts showing profiles of a sacrificial layer.
Figure 7B:
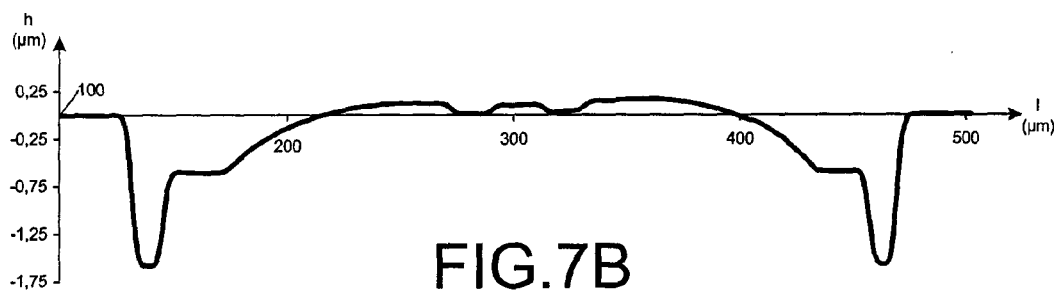
Figure 7C:
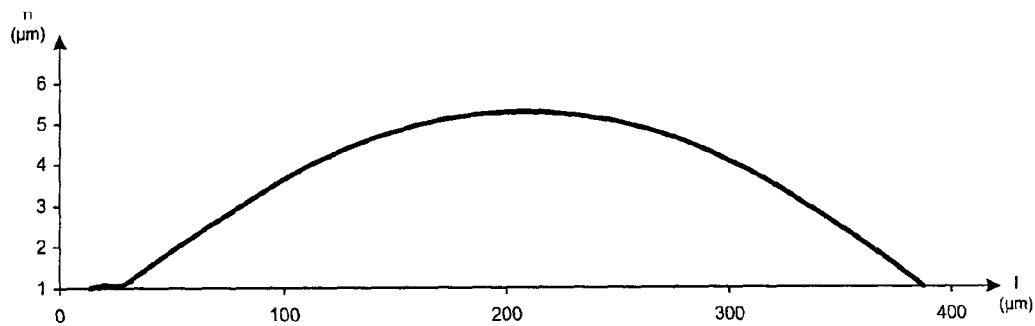

FIGS. 7A to 7C are charts showing profiles relative to a sacrificial layer deposited on a face of a substrate and treated according to the invention. FIG. 7A shows the profile of a first sacrificial layer deposited on the pattern of a substrate containing electrical paths. FIG. 7B shows the thinning of the first sacrificial layer, realised via etching, in order to minimise and even remove the reproduced topology. FIG. 7C shows the profile of the sacrificial layer obtained after the deposit of a second planarising sacrificial layer.

FIGS. 8A to 8I show a method of realizing a "double air gap" variable capacitor by forming a sacrificial layer, in accordance with the invention. These are cross-section views according to one of the axes of the cavity.

Figure 8A:
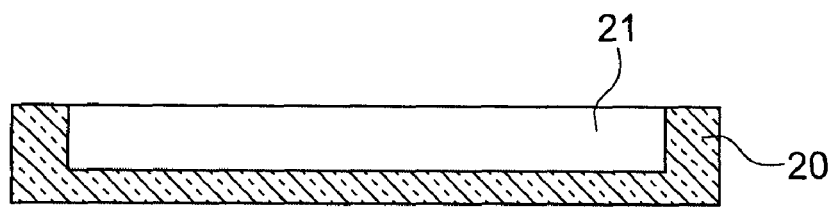
FIGS. 8A to 8I show a method for the realisation of a "double air gap" variable capacitor, in accordance with the invention.

FIG. 8A shows a silicon substrate 20 with a cavity 21 etched using one of its principle faces. The depth of the cavity is greater than 4 µm.

Figure 8B:
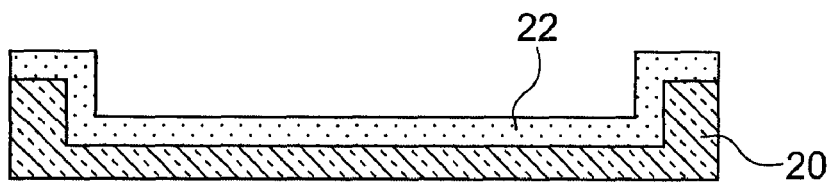
Figure 8C:
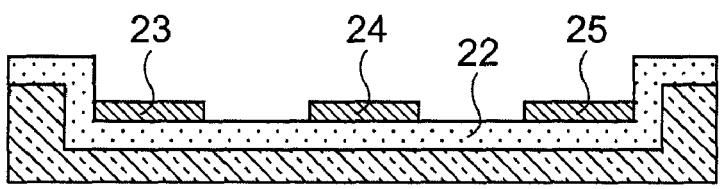

Thermal oxidation is then used on the face of the substrate containing cavity 21 in order to obtain a layer of silicon dioxide 22 of 1 µm in thickness (see FIG. 8B).

The following step consists in depositing electrodes 23, 24 and 25 (lower electrodes) on the oxide layer 22 covering the bottom of cavity 21. These electrodes are constituted by the deposition of layers of Ti/Au or Cr/Au or Pt. The thickness of these electrodes is comprised between 0.02 µm and 0.8 µm (see FIG. 8C).

Figure 8D:
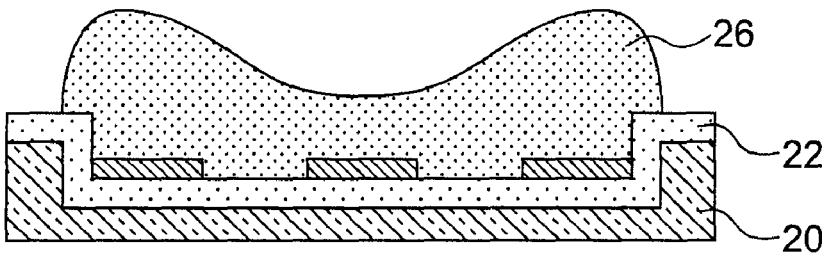
Figure 8E:
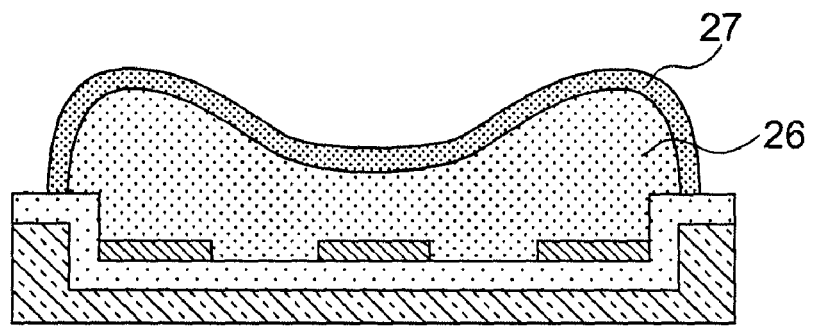
Figure 8F:
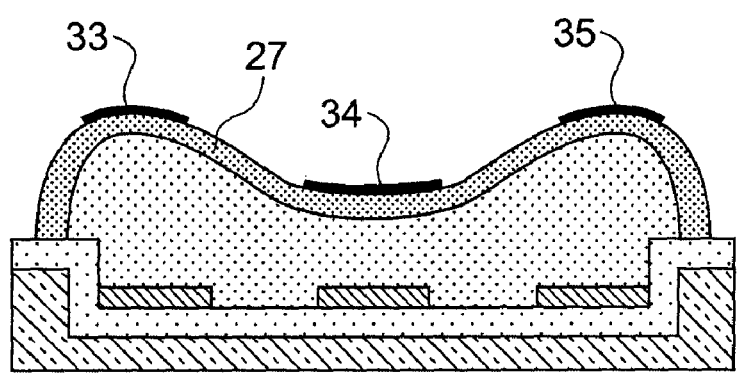

Then, a trilayer sacrificial layer 26 is deposited in the cavity and overflows from this cavity (see FIG. 8D). The photosensitive resin is deposited in the following manner. A first layer of resin of 2.5 µm in thickness is formed in the cavity (or the cavities of a same substrate for collective manufacture). Thermal cycle annealing up to 350° C., with a slope of 5° C./min, is applied to the resin. After this annealing, the layer of polymer obtained is thinned by 1 µm via oxygen plasma etching with a power level chosen according to the desired etching speed, for example 100 W of power. This makes it possible to minimise, even remove, the topology reproduced by the lower electrodes. Using the same mask, a second thicker layer of resin (approximately 4.5 µm) is deposited. The same thermal treatment causes the appearance of two peaks at the edges of the cavities without filling them. Thinning is then carried out in order to start the deposition of the third layer and remove the reliefs created outside the cavity (or cavities). Still using the same thermal treatment, a third layer of 4 µm in thickness gives the final "double air gap" look. The resin used is for example a novolac polymeric resin very commonly used in microelectronics.

The following step consists in depositing a first layer 27 of dielectric material on the sacrificial layer 26. Layer 27 can have a thickness of 0.4 µm (see FIG. 8E).

By a method well known by those skilled in the art, electrodes 33, 34 and 35 (upper electrodes) are then deposited on the dielectric layer 27 and next to lower electrodes 23, 24 and 25. These electrodes are constituted by the deposition of layers of Ti/Au or Cr/Au or Pt. The thickness of these electrodes is comprised between 0.02 μm and 0.8 μm (see FIG. 8F).

Figure 8G:
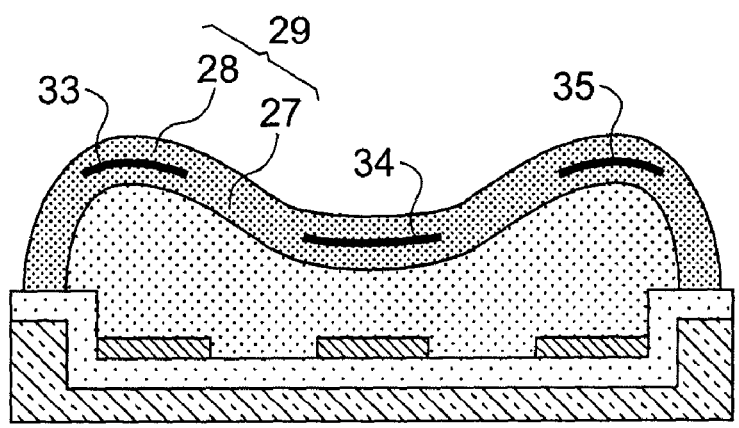

A second layer 28 of dielectric material is deposited on the structure obtained as shown in FIG. 8G. Layer 28 encompasses upper electrodes 33, 34 and 35. Its thickness is calculated, according to the thickness of the first dielectric layer 27, in order to supply the desired thickness of suspended element 29 (beam or membrane).

Figure 8H:
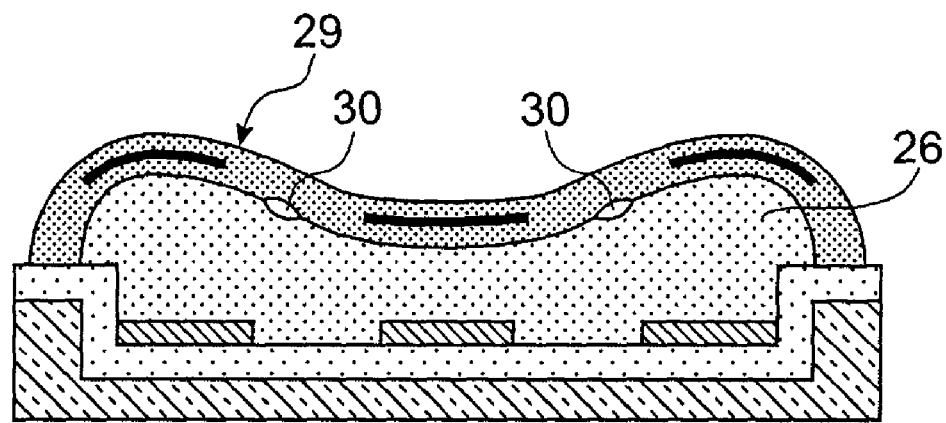
Figure 8I:
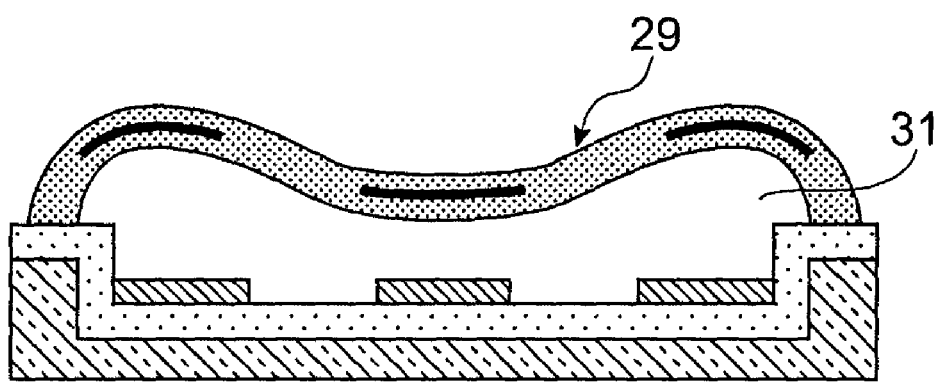

Openings 30 are then practiced in order to access sacrificial layer 26 (see FIG. 8H).

The last step consists in releasing suspended element 29 via etching of the sacrificial layer. This releasing is obtained thanks to a plasma trapped in a chamber, which allows it to act isotropically ("downstream" method). The plasma is chosen according to the etching selectivity between the material of the suspended element and the material of the sacrificial layer. The plasma can be an $N_2O_2$ plasma or a $CHF_4$ plasma. Etching parameters for the sacrificial layer are for example: temperature 250° C., pressure 1100 mTorr, 2700 W microwave power, duration of 180 seconds for an $N_2O_2$ plasma.

Figure 9:
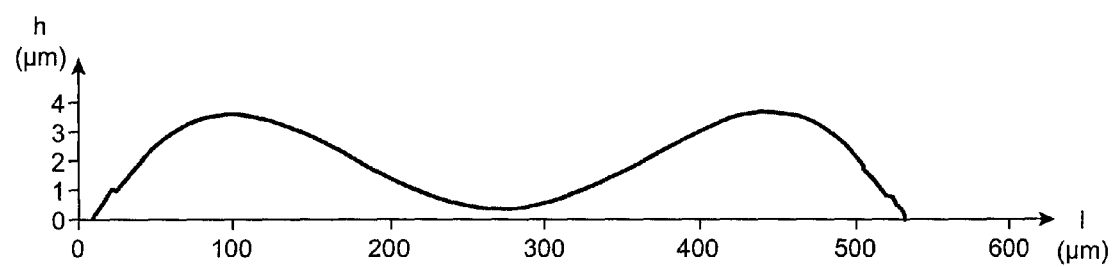
FIGS. 9 and 10 are other charts showing profiles of sacrificial layers.
Figure 10:
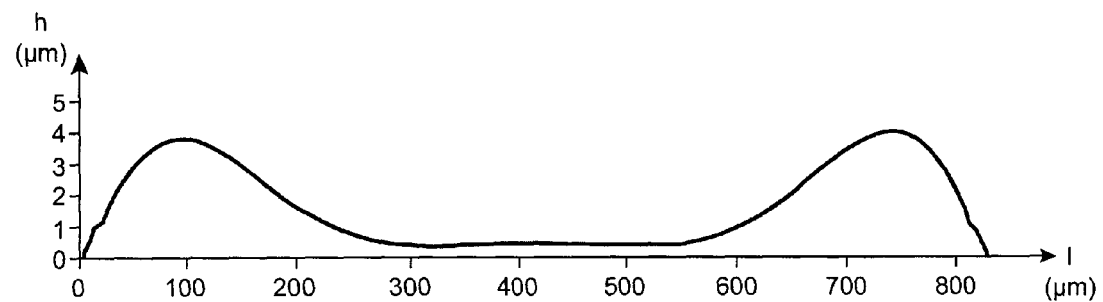

Complementarily, FIGS. 9 and 10 are charts showing profiles of sacrificial polymeric layers, formed of three layers in both cases. The sacrificial layer of FIG. 9 is obtained for a pattern whose cavity dimensions are 500 μm×500 μm. That of FIG. 10 is obtained for a pattern whose cavity dimensions are 800 μm×800 μm.

The advantages of the method according to the invention are the following:
- obtaining of a "double air gap" structure by forming the sacrificial layer,
- method that is less expensive than those of prior art: a single mask is used to realize the "double air gap" instead of two or more in known art,
- forming the sacrificial layer is generic, with other profiles being possible and potentially interesting for other components.

The realisation of the portion of an MEMS comprised of a cavity and a beam whose displacement is controlled by an actuation voltage applied to two facing electrodes shall now be detailed more precisely.

The actuation voltage generates an electrostatic force $F_E$ such that:

$$F_E = \frac{\varepsilon_0 S V^2}{2 d_0}$$

with:

$\varepsilon_0 = 8.854 \cdot 10^{-12}$ farad·m$^{-1}$

S=facing electrode surface

V=actuation voltage $d_0$=initial gap

At balances forces $F_E + F_{rappel} = 0$

Thus:

$$\frac{\varepsilon_0 S V^2}{2 d_0} + ky = 0$$

k being the rigidity of the variable capacitance $$\text{(mobile portion: beam)} = \frac{192 \, EI}{L^3}$$

E being Young's module (characteristic of the material)

$$I \text{ being inertia} = \frac{w^3 h}{12}$$

(w being the width of the beam and h its thickness)

Therefore, using all of these expressions, values for L, w, h and y can be determined making it possible to satisfy the actuation voltage in the specifications.

Note: E is according to the material chosen, and h (thickness of the mobile structure) depends in part on the process (thickness of the layer required in order to ensure electrical continuity and possible minimum or maximum thickness by the chosen method of deposition, etc.).

L and w give the dimensions in x and y of the cavity:
L=length of the beam=length of the cavity
w=width of the beam, thus the width of the cavity will be equal to w+two zones on each side for the releasing (for example 50 μm, i.e. a cavity width of w+100 μm)

y will give the depth of the cavity:
For a switch, contact must be made between the deviated beam and the bottom of the cavity: cavity depth=y,
For variable capacitance, it is more complex due to the "pull-in" etc.

Note that several sets of L, w, y values can satisfy the specifications.

Now, the cavity depth is known. It will be of a magnitude of a few hundred nm to a few μm for a beam ranging from a few μm to a few dozen or hundred μm in length for a few hundred nm to a few dozen μm in width.

A sacrificial resin must be used allowing a thickness to be obtained that is greater than this depth. Resins used in photolithography are known and characterised by a maximum coating thickness. This data is data from the manufacturer, provided when the resins are purchased. The following table summarizes a few characteristics of the resins available commercially.

| Resin | Polarity | Thickness | Uniformity |
|---|---|---|---|
| JSR PFR IX420H 19 cP | R+ | 1 μm < Ep < 2 μm | +/−2% |
| JSR PFR IX 500EL 30 cP | R+ | 1 μm < Ep < 2 μm | +/−2% |
| JSR PFR IX 335H 30 cP | R+ | 2 μm < Ep < 5 μm | +/−2% |
| Clariant AZ 4562 | R+ | 5 μm < Ep < 12 μm | +/−4% |
| Clariant AZ 5740 | R+ | 10 μm < Ep < 50 μm | +/−4% |
| Shipley S 1805 | R+ | 0.5 μm < Ep < 1 μm | +/−2% |
| Shipley: S 1813 SP15 | R+ | 1 μm < Ep < 2 μm | +/−2% |
| Shipley: S1828 | R+ | 2 μm < Ep < 5 μm | +/−2% |
| NFR 012 | R− | 1 μm < Ep < 6 μm | +/−2% |
| NFR 015 | R− | 5 μm < Ep < 15 μm | +/−2% |
| Cyclotene: BCB 4022 | R− | 2.5 μm < Ep < 5 μm | 4% |
| Cyclotene: BCB 4024-40 | R− | 3.5 μm < Ep < 7 μm | 4% |
| Cyclotene: BCB 4026-46 | R− | 8 μm < Ep < 14 μm | 4% |
| Cyclotene: BCB 4050 | R− | 14 μm < Ep < 30 μm | 4% |
| Cyctotene: BCB 4024-40 dilué au mésiténe | R− | 1.25 μm | +/−0.25 μm |
| Arch: durimide 7505 | R− | 0.5 μm < Ep < 3.5 μm | 4% |
| Arch: durimide 7510 | R− | 3.5 μm < Ep < 7 μm | 4% |
| Arch: durimide 7520 | R− | 8 μm < Ep < 14 μm | 4% |

DOCUMENTS MENTIONED

[1] "Strength of materials", S. TIMOSHENKO, published by D. Van Nostrand Co., Inc., Princeton, N.J., 1941.

[2] "Fabrication of high power RF MEMS switches", L. WANG et al., Microelectronic Engineering 83 (2006) 1418-1420.

[3] "Development of a wide tuning range two parallel plate tunable capacitor for integrated wireless communication systems", J. ZOU et al., John Wiley and sons, 2001, pages 322 to 329.

[4] "Development of a wide tuning range MEMS tunable capacitor for wireless communication systems", J. ZOU et al., University of Illinois, Urbana, Ill., USA, 0-7803-6438-4/00, IEEE, 2002.

The invention claimed is:

1. A method of forming a sacrificial layer used to form a suspended element on a substrate, comprising:
   depositing a resin on a substrate;
   forming the resin according to a lithography process to provide a lithographed resist pattern on a zone of the substrate, the zone having a size and form determined by a resonance frequency range for the suspended element and the resin, the pattern occupying a volume in accordance with the resonance frequency range and the resin;
   annealing the lithographed resist pattern to form the lithographed resin into a profile in accordance with a thermal cycle thereof, the profile being one of a planarizing domed profile and a double air gap profile,
   wherein the resonance frequency range determines an interval separating the suspended element from said substrate zone, the resin being chosen to provide said interval.

2. The method according to claim 1, wherein the resin is a photosensitive polymeric resin.

3. The method according to claim 1, wherein said zone of the substrate is the bottom of a cavity realised in the substrate.

4. The method according to claim 1, wherein, said zone of the substrate has a surface topology, and the lithography and annealing steps include:
   forming a first layer of resin according to a lithography process using a mask having a first pattern element,
   annealing the first pattern element,
   thinning the first pattern element to minimize the surface topology of said zone reproduced on a surface of the first pattern element,
   forming a second layer of resin deposited on the substrate according to the lithography process using a mask having a second pattern element superposed on the first thinned pattern element in order to constitute said pattern,
   annealing the pattern to generate a planarizing domed profile.

5. The method according to claim 1, wherein, said zone of the substrate has a surface topology, and the lithography and annealing steps include:
   forming a first layer of resin according to a lithography process using a mask having a first pattern element,
   annealing the first pattern element,
   thinning the first pattern element to minimize the surface topology of said zone reproduced on the surface of the first pattern element,
   forming a second layer of resin deposited on the substrate according to the lithography process using a mask having a second pattern element superposed on the first thinned pattern element,
   annealing the superposition of the first pattern element and the second pattern element to cause a double gap profile having two peaks on said superposition,
   forming a third layer of resin deposited on the substrate according to the lithography process using a mask having a third pattern element superposed on the first pattern element and the second thinned pattern element, and
   annealing the superposition of pattern elements to generate a final double air gap profile.

* * * * *